United States Patent [19]

Reitter

[11] Patent Number: 5,095,891

[45] Date of Patent: Mar. 17, 1992

[54] CONNECTING CABLE FOR USE WITH A PULSE GENERATOR AND A SHOCK WAVE GENERATOR

[75] Inventor: Josef Reitter, Moehrendorf, Fed. Rep. of Germany

[73] Assignee: Siemens Aktiengesellschaft, Berlin and Munich, Fed. Rep. of Germany

[21] Appl. No.: 49,517

[22] Filed: May 14, 1987

[30] Foreign Application Priority Data

Jul. 10, 1986 [DE] Fed. Rep. of Germany ....... 3623277

[51] Int. Cl.⁵ .............................................. A61B 17/22
[52] U.S. Cl. ........................... 128/24 OEL; 606/128; 174/75 C
[58] Field of Search ............... 128/24 A, 328, 908; 174/75 C; 606/127, 128

[56] References Cited

U.S. PATENT DOCUMENTS

| | | | |
|---|---|---|---|
| 3,598,895 | 8/1971 | Garland | 174/75 C |
| 3,701,086 | 10/1972 | Somerset | 174/75 C |
| 4,155,852 | 5/1979 | Fischel et al. | 128/908 |
| 4,599,483 | 7/1986 | Kuhn et al. | |
| 4,641,649 | 2/1987 | Wolinsky et al. | 128/328 |
| 4,669,472 | 6/1987 | Eisenmenger | 128/24 A |
| 4,674,505 | 6/1987 | Pauli et al. | 128/24 A |
| 4,766,888 | 8/1988 | Oppelt | 128/24 A |
| 4,782,821 | 11/1988 | Reitler | 128/24 A |

FOREIGN PATENT DOCUMENTS 3146627 6/1983 Fed. Rep. of Germany .
689813 4/1953 United Kingdom .

OTHER PUBLICATIONS

B. K. Ratnikov, "Shaping of Rectangular Field Pulses In Inductance Type Driving Magnet", Jun. 1980 issue of Instruments and Experimental Techniques, pp. 679-682.

Primary Examiner—Lee S. Cohen
Attorney, Agent, or Firm—Hill, Van Santen, Steadman & Simpson

[57] ABSTRACT

An apparatus for disintegrating calculi situated in the body of a life form having a cable with a shielded middle conductor connecting a pulse generator and a shock wave generator. The connecting cable is a triaxial cable that has a middle conductor having two concentric shieldings. The middle conductor and the first shielding form forward and return conductors and the second shielding is connected to ground at both ends.

6 Claims, 1 Drawing Sheet

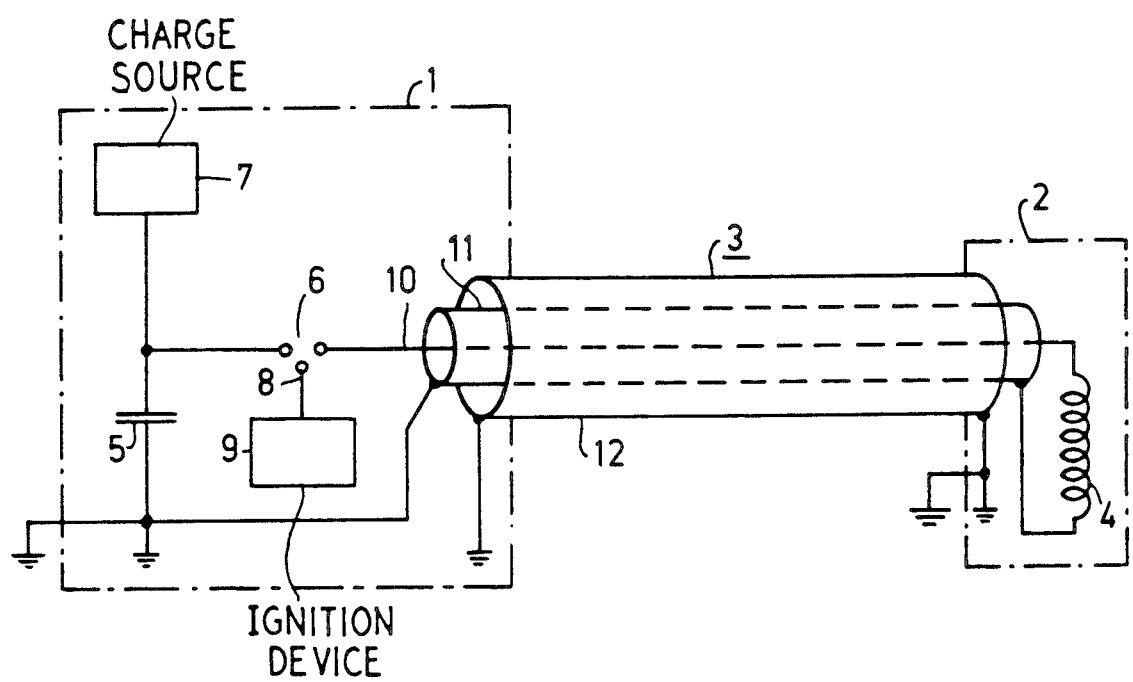

CONNECTING CABLE FOR USE WITH A PULSE GENERATOR AND A SHOCK WAVE GENERATOR

BACKGROUND OF THE INVENTION

The present invention is directed to a cable for use in an apparatus for the disintegration of calculi situated in the body of a life form, and in particular, to a cable which has a shielded neutral conductor connecting a pulse generator to a shock wave generator.

German Patent No. 31 46 627 discloses a prior art connecting cable which has the form of a radio frequency coaxial cable and connects a pulse generator to a shock wave generator, that is, an underwater spark gap. The neutral or middle conductor of the cable transmits the voltage, whereas the shielding is connected to the ground of the pulse generator and simultaneously functions as the return conductor from the shock wave generator. Since high currents briefly flow via the connecting cable when shock waves are generated, a great voltage drop occurs at the connecting cable. Thus, a high voltage is adjacent the shielding in the region of shock wave generator and is dangerous to anyone touching the shielding of the connecting cable. The housing of the shock wave generator can therefore not be directly connected to the shielding of the cable.

SUMMARY OF THE INVENTION

It is an object of the present invention to provide a connecting cable which exhibits low inductance and has a potential free grounded connection between the pulse generator and the shock wave generator.

The connecting cable of the present invention is a triaxial cable which has a neutral or middle conductor having two concentric shieldings. The middle conductor and the first shielding form the forward and return conductors and the second shielding is connected to housing grounds of both the pulse generator and the shock wave generator. It is an advantage of the present invention that the transmission cable of the shock wave pulses has low leakage inductance and a potential free shielding that simultaneously provides a ground connection between the pulse generator and the shock wave generator. Thus, the voltage difference between the two housings can be kept to a minimum when the middle conductor is the forward conductor and the first shielding is the returned conductor.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, and in which:

The FIGURE depicts a schematic representation of the cable of the present invention connecting a pulse generator to a shock wave generator.

DESCRIPTION OF THE PREFERRED EMBODIMENT

The present invention has general applicability but is most advantageously utilized in an apparatus for disintegrating calculi situated in the body of a life form. In general terms, the present invention has a pulse generator with a means for storing a charge and a means for generating a pulse on an output. The means for pulse generating is connected to the charge storage means. A shock wave generator having a primary coil is provided. A cable connects the pulse generator to the shock wave generator and has a middle conductor connected to the output of the pulse generator and to a first end of the primary coil in the shock generator. A first shielding connects to a grounded side of the means for storing a charge in the pulse generator and to a second end of the primary coil in the shock wave generator. A second shielding is connected to the housing grounds of the pulse generator and the shock wave generator. The middle conductor, the first shielding and the second shielding, are insulated from each other and form a triaxial cable. In the preferred embodiment of the present invention, the middle conductor is a forward conductor and the first shielding is a returned conductor.

As shown in the FIGURE, a pulse generator 1 is connected to a shock wave generator 2 via a connecting cable 3. The shock wave generator 2 is of the type known as a shock wave tube. The essential component of the shock wave generator 2 with regards to the present invention, is shown schematically in the FIGURE as primary coil 4 which produces shock waves for the disintegration of the calculi when used in combination with a secondary membrane (not shown) when the primary coil 4 is charged with pulses. Referring now to the pulse generator 1, upon ignition of a spark gap 6, a capacitor 5 is suddenly discharged pulse-like and the pulse is transmitted via the connecting cable 3 to the primary coil 4. The capacitor 5 is recharged by the charging means 7. For ignition, the spark gap 6 has an auxiliary electrode 8 which is connected to an ignition device 9 for individual triggering of shock waves. A periodic sequence of triggerings or a heart triggered and/or respiration-triggered triggering of shock waves may be provided.

The connecting cable 3 is fashioned as a triaxial cable which has two concentric shieldings 11 and 12. The first shielding 11 is insulated from a middle conductor 10 and is concentrically arranged around the middle conductor 10 of the connecting cable 3. A second shielding 12 concentrically surrounds the first shielding 11 and the middle conductor 10. It is likewise insulated from the first shielding 11. The overall connecting cable 3 is finally surrounded by an insulating sheath.

The spark gap 6 is connected to one terminal of the primary coil 4 by means of the middle conductor 10 of the connecting cable 3 and functions as a forward conductor. The other terminal of the primary coil 4 is connected to the first shielding 11 of the connecting cable 3 which serves as a return conductor. In the pulse generator 1, the first shielding 11 is connected to the grounded terminal of the capacitor 5 and is not connected to the spark gap 6. The second shielding 12 of the connecting cable 3 is connected at one end to the pulse generator 1 and at the other end to the shock wave generator 2, that is, the ends of the second shielding 12 are connected to ground or, respectively, to the housings of the generators.

Thus, the present invention provides for electrical pulses for generating shock waves to be transmitted from the pulse generator 1 to the shock wave generator 2 through a low inductance coaxial cable composed of the middle conductor 10 and the first shielding 11. The second shielding 12 thereby serves as further shielding and for a grounding connection of the pulse generator 1 and of the shock wave generator 2. Furthermore, the middle conductor 10, the first shielding 11 and the second shielding 12 form a triaxial cable.

The invention is not limited to the particular details of the apparatus depicted and other modifications and applications are contemplated. Certain other changes may be made in the above described apparatus without departing from the true spirit and scope of the invention herein and involved. It is intended, therefore, that the subject matter in the above depiction shall be interpreted as illustrative and not in a limiting sense.

What is claimed is:

1. An apparatus for disintegrating calculi situated in the body of a life form, comprising:
    connecting cable having at least a shielded middle conductor connected between a pulse generator and a shock wave generator, said connecting cable being a triaxial cable having a first and second concentric shielding around said middle conductor, whereby said middle conductor and said first concentric shielding form forward and return conductors and said second shielding is connected to ground on both ends thereof.

2. The apparatus described in claim 1, wherein said middle conductor is said forward conductor and said first shielding is said return conductor.

3. An apparatus for disintegrating calculi situated in the body of a life form comprising:
    middle conductor connecting a pulse generator to a shock wave generator;
    first shielding concentrically surrounding said middle conductor, said middle conductor and said first shielding transmitting pulses from the pulse generator to the shock wave generator;
    second shielding concentrically surrounding said first shielding and connected to ground at the pulse generator and connected to ground at the shock wave generator.

4. The apparatus described in claim 3, wherein said middle conductor is a forward conductor and said first shielding is a return conductor.

5. An apparatus for disintegrating calculi situated in the body of a life form, comprising:
    pulse generator having means for storing a charge and means for generating a pulse on an output, said means for generating a pulse connected to said means for storing a charge;
    shock wave generator having a primary coil;
    cable for connecting said pulse generator to said shock wave generator having middle conductor connected to said output of said pulse generator and to a first end of said primary coil in said shock wave generator, first shielding connected to a grounded side of said means for storing a charge in said pulse generator and to a second end of said primary coil in said shock wave generator, and second shielding connecting housing grounds of said pulse generator and said shock wave generator, said middle conductor, said first shielding and said second shielding insulated from each other and forming a triaxial cable.

6. The apparatus described in claim 5, wherein said middle conductor is a forward conductor and said first shielding is a return conductor.

* * * * *